United States Patent [19]

Tani

[11] 4,324,329

[45] Apr. 13, 1982

[54] DEVICE FOR MOUNTING AN ELECTRICAL CIRCUIT COMPONENT PART SUCH AS AN ELECTROLYTIC CAPACITOR

[76] Inventor: Isao Tani, 1-36-8, Kaname-cho, Toshima-ku, Tokyo, Japan

[21] Appl. No.: 105,527

[22] Filed: Dec. 20, 1979

[30] Foreign Application Priority Data

Jan. 19, 1979 [JP] Japan .............................. 54-5172[U]
Jun. 21, 1979 [JP] Japan ............................ 54-78540[U]
Jun. 21, 1979 [JP] Japan ............................ 54-85352[U]
Jun. 29, 1979 [JP] Japan ............................ 54-89417[U]

[51] Int. Cl.³ ........................................... B65D 73/02
[52] U.S. Cl. ................................................ 206/328
[58] Field of Search .................. 206/328; 220/19; 211/66; 248/60, 317

[56] References Cited

U.S. PATENT DOCUMENTS 2,279,237 4/1942 Kellems ................................ 211/66
2,688,961 9/1954 Thomas ............................... 248/317
2,766,899 10/1956 Wallace ................................. 226/19
3,126,441 3/1964 Nichols ............................... 206/328
3,310,623 3/1967 Vaughan ............................ 206/328

Primary Examiner—Herbert F. Ross
Attorney, Agent, or Firm—Schwartz, Jeffery, Schwaab, Mack, Blumenthal & Koch

[57] ABSTRACT

The device is adapted to mount a cylindrical, electrical circuit component part such as an electrolytic capacitor on a mounting base plate such as a chassis. The device comprises a cylindrical main section into which the electrical circuit component part is inserted and a base plate molded from elastic synthetic resin such that it is integral with the cylindrical main section. The cylindrical main section comprises a network of a combination of strips diagonally arranged with respect to the axis of the cylindrical main section such that they run in two directions. The electrical circuit component part is mounted with respect to the base plate by attaching the base plate of the device to the mounting base plate.

6 Claims, 13 Drawing Figures

DEVICE FOR MOUNTING AN ELECTRICAL CIRCUIT COMPONENT PART SUCH AS AN ELECTROLYTIC CAPACITOR

BACKGROUND OF THE INVENTION

This invention relates to a novel device for sufficiently firmly mounting a cylindrical, electronic circuit component part such as an electrolytic capacitor on a chassis without difficulty, which permits efficient assembly of the electrical circuit component part and provides increased strength against vibrations etc.

As shown in the art, a large-capacity electrolytic capacitor is cylindrically formed having a diameter of several centimeters or more. The capacitor is mounted with respect to a chassis and electrically connected to the other electrical circuit component parts. As the electrolytic capacitor is larger in size and heavier in weight, it is sufficiently mechanically firmly mounted with respect to the chassis.

The electrolytic capacitor mounting member is constructed mainly of a metal band such as aluminum. For example, two mounting pieces are formed integral with the side of the band such that they project outwardly. That is, the metal band is wrapped around the outer periphery of the electrolytic capacitor with one end portion of the metal band connected by a screw to the other end portion of the metal band. The metal band wrapped around the capacitor is mounted by connecting the mounting pieces by screws to a chassis. In this case, however, it is necessary to first tighten the metal band around the outer periphery of the electrolytic capacitor and then screw the mounting pieces of the metal band on the chassis. Therefore, the mounting operation becomes cumbersome, lowering the efficiency of the device mounting operation. Moreover, since the metal band is wrapped around the outer periphery of the electrolytic capacitor and then one end portion of the metal band is screwed to the other end portion of the metal band, the screw tends to loosen. When, in particular, mechanical vibration is applied to the screwed portion, the screw tends to loosen. In an electronic apparatus mounted, for example, on the rolling stock, aircraft etc. care must be exercised to mount such an electrical circuit component part.

SUMMARY OF THE INVENTION

One object of this invention is to provide a device for mounting an electrical circuit component part of a relatively large size and weight, such as an electrolytic capacitor, on a mounting surface such as a chassis by a simple operation.

Another object of this invention is to provide a device for mounting an electrical circuit component part on a mounting surface, which assures a positive mounting of the electrical circuit component part even if great mechanical vibrations occur and assures full safety of the mounting even if it is used in the assembly of an electronic apparatus mounted on rolling stock, aircraft etc.

That is, the mounting device of this invention is constructed mainly of a cylindrical main section made of an elastic synthetic resin and into which a corresponding cylindrical, electrical circuit component part is fitted. The cylindrical main section comprises a network of a combination of strips diagonally arranged with respect to the axis of the cylindrical main section.

BRIEF DESCRIPTION OF THE DRAWING

This invention will be described by way of example by referring to the accompanying drawings in which.

DETAILED DESCRIPTION OF THE PREFERRED EMBODIMENTS

Figure 1:
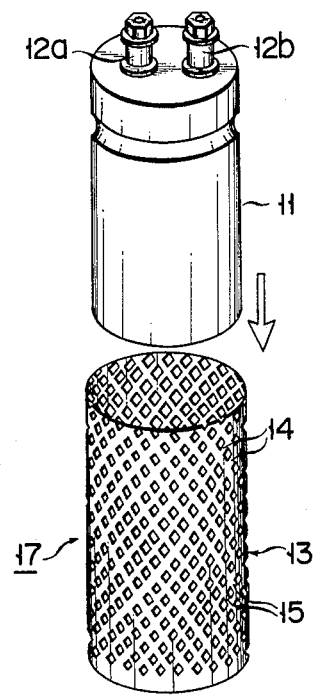
FIG. 1 is a perspective view showing a relation between an electrolytic capacitor and a mounting device according to one embodiment of this invention.
Figure 2:
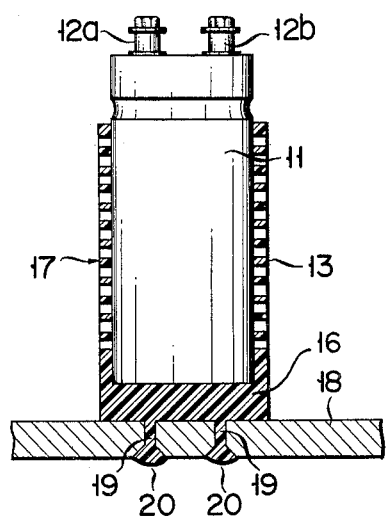
FIG. 2 is a cross-sectional view showing the mounting device of FIG. 1 mounted on the base plate of the electrolytic capacitor.

One embodiment of this invention will now be described below in connection with an electrolytic capacitor 11 which is used as one of the parts of an electric circuit. The electrolytic capacitor 11 is of a cylindrical configuration and has a pair of positive and negative electrodes 12a, 12b projecting from one end thereof. The electrolytic capacitor 11 is inserted in an arrow-indicated direction into a cylindrical main section of a mounting device which is molded from elastic synthetic resin, such as polypropylene, having excellent heat-resistant and corrosion-resistant properties. The cylindrical main section 13 of the mounting device is one-piece molded and comprises a network of a combination of strips 14 and 15 which are diagonally arranged with respect to the axis of the cylindrical main section 13 of the mounting device. The cylindrical main section 13 of the device has one end closed by a base plate 16 and the electrolytic capacitor 11 is inserted into the other end, i.e. the open end, of the cylindrical main section 13. The device 17 comprises the main section 13 and base plate 16 and is mounted on a mounting base plate 18, such as a chassis, as shown in FIG. 2. That is, the base plate 16 of the device 17 is mounted on the mounting base plate 18 by inserting projections or legs 19 provided at the outer surface of the base plate 16 into the corresponding holes of the base plate 18 and causing the forward end portion of the projections 19 to be thermally fused by, for example, a soldering iron to the rear surface of the base plate 18 as in the case of riveting (see FIG. 2). The electrolytic capacitor 11 is mounted with respect to the mounting base plate 18 by attaching the device 17 to the base plate 18 and then inserting the electrolytic capacitor 11 into the cylindrical main section 13 of the mounting device. The cylindrical main section 13 of the device is selected to have an inner diameter substantially the same as the outer diameter of the electrolytic capacitor 11. When the capacitor 11 is inserted into the opening of the cylindrical main section 13 of the device with the former in alignment with the latter the meshes of the network of diagonal strips 14, 15 are expanded due to a compressive force axially acting upon the cylindrical main section 13 to permit the inner diameter of the cylindrical main section 13 to become larger. In consequence, the capacitor 11 is smoothly inserted into the opening of the cylindrical main section 13 such that the former is firmly set with respect to the latter. If, once inserted, an attempt is made to draw the capacitor 11 out of the cylindrical main section, the latter is deformed such that it is stretched in the axial direction of the cylindrical main section. As a result, a force tending to cause the inner diameter of the cylindrical main section to become smaller strongly acts upon the main section of the device. Once being set into the cylindrical main section 13, therefore, the capacitor 11 is very difficult to draw out of the cylindrical main section and thus very strongly attached to the cylindrical main section 13.

Figure 3A:
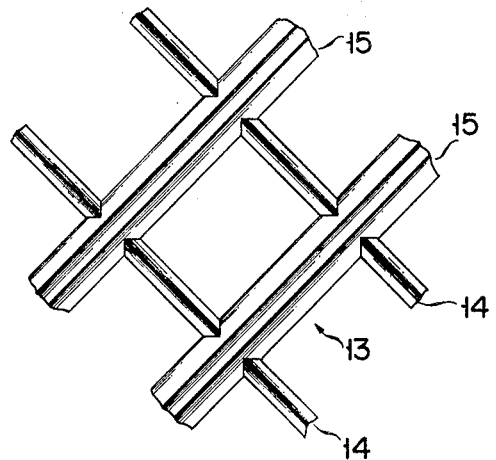
FIGS. 3A and 3B fragmentary views showing part of the mounting device of FIG. 1.
Figure 3B:
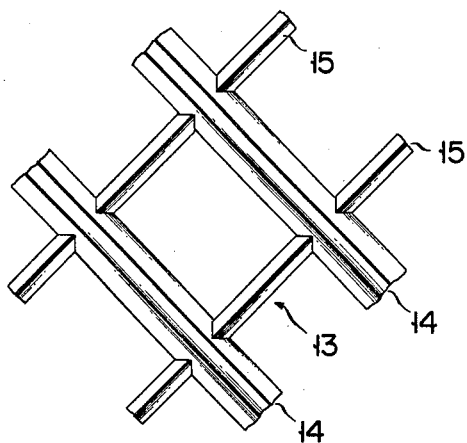
Figure 4:
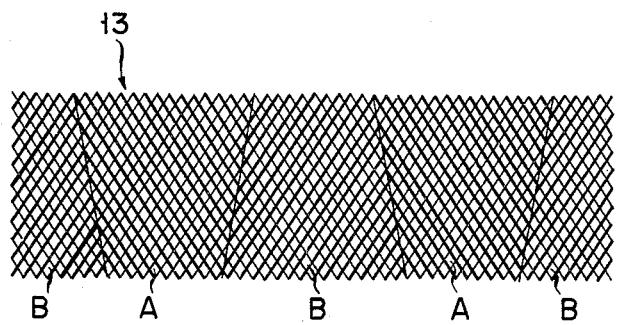
FIG. 4 is an expansion plan view showing the manner in which the structures of FIGS. 3A and 3B are combined together.

The strip network (14, 15) constituting the main section of the device is formed to have such a cross-sectional area that the inner surface of the strips 14 and 15 provides a line contact with the outer surface of the electrolytic capacitor 11. This is accomplished by causing the inner surface of one of the two groups of strips 14 and 15 to project further than that of the other group as shown in FIGS. 3(A) and 3(B). In this manner when an attempt is made to draw the capacitor 11 out of the cylindrical main section a twisting force acts upon the latter to cause the inner diameter of the cylindrical main section to advantageously become smaller. If in a network of a combination of adjacent network segments A and B (see FIG. 4), each having two groups of strips 14 and 15 of different widths, the segments are alternately arranged such that each of the strips in one group of one network segment (for example strips 14 of Segment A) corresponding in direction to each of the strips of the other group in the other segment (strips 15 of group B), twisting forces produced in the adjacent segment networks are cancelled with respect to each other, permitting an effective action upon the capacitor 11 of only a force which tends to cause the inner diameter of the cylindrical main section to become smaller. The demarcation lines of the alternately arranged network segments may be provided not only in a direction nearly parallel with the axis of the cylindrical main section as shown in an expansion plan in FIG. 4, but also in a direction substantially vertical to the axis of the cylindrical main section.

When the electrolytic capacitor 11 is inserted into the mounting device or when a mechanical vibration is applied to the capacitor 11 fitted into the device, a local force acts upon the joining portion of the device where the network of the cylindrical main section is joined to the base plate 16 which is a relatively rigid structure. For this reason, there is a possiblity that a boundary portion of a relatively weak structure between the base plate 16 and the network main section 13 will be broken.

Figure 5:
FIG. 5 shows the portion of the device where the main section of the device is joined to the base plate thereof.

If, however, as shown in FIG. 5 no meshes are provided, over that network area adjacent the base plate 16 of the device (corresponding to one to three rows of meshes) a force exerted upon said boundary portion is dispersed, effectively preventing the occurrence of breakage.

The mounting device as mentioned above is molded from elastic synthetic resin using a cylindrical female mold conforming to the outer configuration of the cylindrical main section 13 and a male mold conforming to the inner configuration of the cylindrical main section 13. In this case, the meshes of the network main section 13 are formed by projections provided on the outer periphery of the male mold.

If, however, a molten resin is poured into a gap defined by the projections of the male mold in mating engagement with the female mold and solidified there, a molded article can not be easily removed from the male mold. That is, the cylindrical mounting device can not be easily removed from the molds using an normal synthetic resin molding technique. However, the device including the network main section 13 as a primary section can be easily removed using a method as will be described later.

Figure 6A:
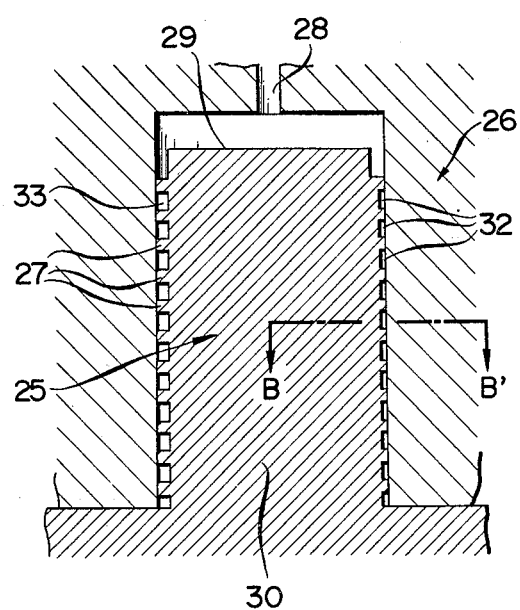
FIG. 6A is a cross-sectional view for explaining the molding of the mounting device and FIG. 6B is a cross-sectional view as taken along line B—B in FIG. 6.
Figure 6B:
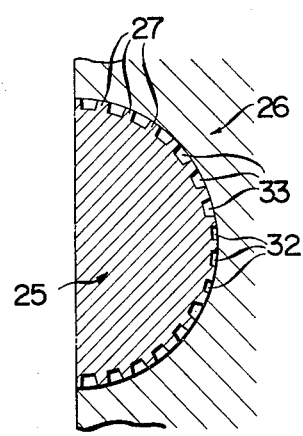
Figure 7:
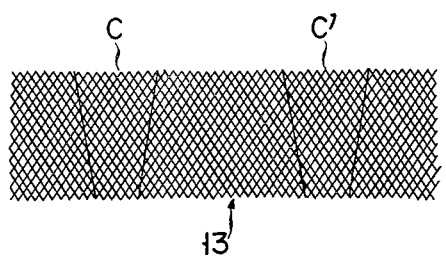
FIG. 7 is an expansion plan view showing a mounting device which is formed using molds.
Figure 8:
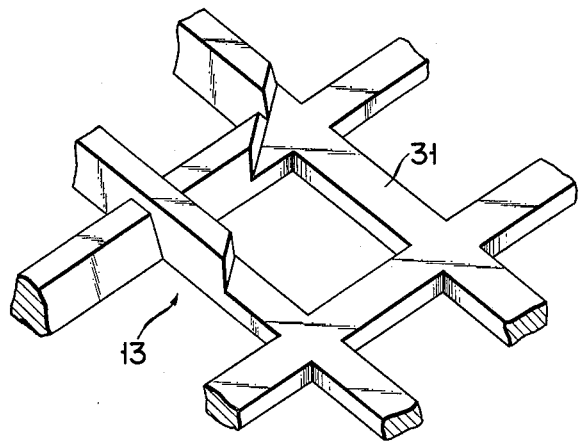
FIG. 8 is a fragmentary view showing part of the molded article of FIG. 7.

FIG. 6A shows the state in which male and female molds for molding the device of this invention are brought into a mating engagement with each other. The male mold has a plurality of projections on the outer periphery thereof, the projections corresponding to the meshes of the network main section 13. A molten synthetic resin is poured through a passage 28 formed in the bottom wall of the female mold 26. The forward end portion 29 of the male mold 25 has an outer diameter somewhat smaller than that of the remaining portion 30 of the male mold so that the male mold 25 can be easily drawn away from the female mold 26. In a device so formed, those wedge like areas C and C' of the network main section 13 which have their demarcation lines narrowed toward the base of the male mold as indicated in expansion plan in FIG. 7 correspond to thinner wall areas 31 (FIG. 8) of strips 14 and 15 of the network main section 13. That is, as shown in FIG. 6B, those projections of the male mold corresponding to the areas C and C' (see 32) of the network main section 13 are formed such that they are smaller in thickness than those of the male mold corresponding to the remaining areas (see 33) of the network main section 13.

After the molded article bearing male mold has been drawn out of the female mold, the molded article is removed from the male mold in a direction toward the free end of the male mold. When the molded article is removed from the male mold, the strips of the network main section of the molded article ride on the lower projections of the male mold along the areas C and C' of FIG. 7, causing the article to be deformed outwardly to permit it to be removed from the male mold. The smaller-diameter forward end portion (see FIG. 6A) of the male mold also serves to allow the article to be removed from the peripheral surface of the male mold.

Figure 9A:
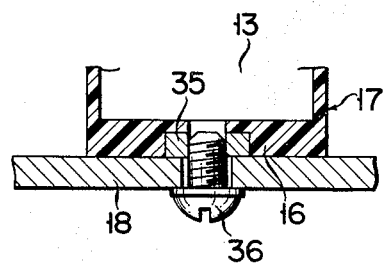
FIGS. 9A and 9B show a mounting means by which the mounting device is mounted on a mounting base plate.
Figure 9B:
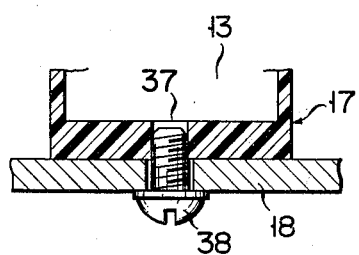

Although the projections or legs 19 may be formed, as shown in FIG. 2, integral with the device 17, a nut 35 (FIG. 9A) may be embedded in the base plate 16 so that a screw 36 can be threaded into the nut with the base plate 18 in between. As shown in FIG. 9B a tapping screw may be threaded into a tapped hole 37 of the base plate 16 with the mounting base plate 18 in between.

Figure 10:
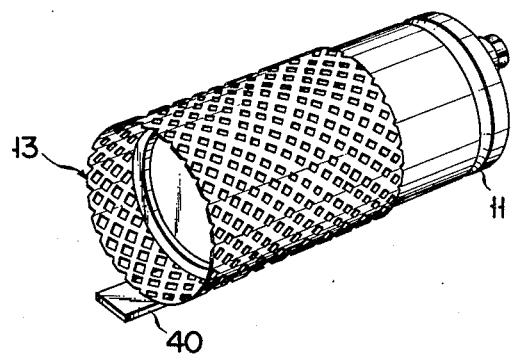
FIG. 10 is a view showing a mounting device according to another embodiment of this invention.

In this way, the device can be mounted on the mounting base plate 18, such as a chassis, with the electrolytic capacitor 11 vertically attached in the device. However, there may arise a need for attaching the electrolytic capacitor horizontally to the base plate 18 in an assembly of an electronic device. In this case, a base plate 40 may be formed on the side surface of a network main section 13 such that it is integral with the network main section 13 as shown in FIG. 10. In this embodiment the network main section 13 is formed as explained in connection with FIGS. 3 and 4 and FIGS. 7 and 8.

What is claimed is:

1. A device for mounting an electrical component part, comprising:

a cylindrical main section into which a corresponding cylindrical electrical component part may be inserted; and a base plate sealing one end of the cylindrical main section and acting as a member to be mounted on a mounting base plate, said cylindrical main section and base plate being formed of elastic synthetic resin such that they are integral with each other, in which said cylindrical main section comprises a combination of a plurality of strips which are diagonally arranged in two directions to form meshes and disposed in symmetry with respect to the axis of the cylindrical main section, and wherein those strips diagonally arranged in one direction project within the cylindrical main section to an extent greater than those strips diagonally arranged in the other direction to permit only said strips diagonally arranged in said one direction to contact the outer peripheral surface of said cylindrical electrical component part when said component part is inserted.

2. A device according to claim 1 in which said strips have such cross-sections that they can be placed in line contact with said electrical component part when the component part is fitted into the cylindrical main section.

3. A device according to claim 1, in which no meshes are provided formed over that network are a portion of said main body adjacent the base plate.

4. A device according to claim 1 in which said cylindrical main section has alternately arranged wedge-like network segments, strips in every other wedge-like network segment being made thinner in a direction of the thickness of said cylindrical main section.

5. A device mounting an electrical component part, comprising:

a hollow main section of elastic synthetic resin for receiving an electrical component part, said main section comprising a network of a combination of a plurality of strips diagonally arranged in two directions along said main section, wherein those strips diagonally arranged in one direction project within the main section to an extent greater than those strips diagonally arranged in the other direction to permit only said strips diagonally arranged in one direction to contact the outer peripheral surface of electrical component part, and a base plate attached to an outer surface portion of the main section to permit the base plate to be mounted on a mounting base plate.

6. A device for mounting an electrical component part, comprising:

a cylindrical main section of elastic synthetic resin for receiving an electrical component part, said cylindrical main section comprising a network of a plurality of network segments alternately arranged such that they are symmetrical with respect to the axis of said cylindrical main section, each network segment comprising two groups of strips running in two directions such that strips in one group diagonally cross strips in the other group, one network segment being arranged with respect to an adjacent network segment such that each of the strips in said one group of said one network segment corresponds to each of the strips in said other group of said adjacent network segment, said one group of strips being made thicker than said other group of strips so that only the strips in said one group in each network segment can be placed in contact with said electrical component part; and a base plate mounted to said main section.

* * * * *